United States Patent [19]

Suzuki

[11] Patent Number: 4,490,690
[45] Date of Patent: * Dec. 25, 1984

[54] STRIP LINE CABLE

[75] Inventor: Hirosuki Suzuki, Tokorozawa Saitama, Japan

[73] Assignee: Junkosha Company, Ltd., Tokyo, Japan

[*] Notice: The portion of the term of this patent subsequent to May 3, 2000 has been disclaimed.

[21] Appl. No.: 370,789

[22] Filed: Apr. 22, 1982

[51] Int. Cl.³ .............................. H01P 3/08
[52] U.S. Cl. .................... 333/1; 333/238; 174/36; 174/117 FF
[58] Field of Search ............ 333/236, 238, 1; 174/110 F, 110 FC, 117 F, 117 FF, 36; 156/52, 53, 55

[56] References Cited

U.S. PATENT DOCUMENTS

| | | | |
|---|---|---|---|
| 3,179,904 | 4/1965 | Paulsen | 333/1 |
| 3,408,453 | 10/1968 | Shelton, Jr. | 174/117 FF X |
| 3,459,879 | 8/1969 | Gerpheide | 333/1 X |
| 3,586,757 | 6/1971 | Haldeman, Jr. | 174/117 FF |
| 3,612,744 | 10/1971 | Thomas | 174/117 FF X |
| 3,764,727 | 10/1973 | Balde | 333/238 X |
| 4,130,723 | 12/1978 | Wakeling | 333/238 X |
| 4,149,026 | 4/1979 | Fritz et al. | 333/238 X |
| 4,368,350 | 1/1983 | Perelman | 174/110 F X |
| 4,382,236 | 5/1983 | Suzuki | 333/238 |
| 4,423,282 | 12/1983 | Suzuki et al. | 174/110 FX |

OTHER PUBLICATIONS

Patrick, *Flexible Strip Transmission Line*, IBM Tech. Disclosure Bulletin, vol. 2, No. 6, Apr. 1960, pp. 35, 36.

*Primary Examiner*—Paul Gensler
*Attorney, Agent, or Firm*—Mortenson & Uebler

[57] ABSTRACT

A stripline cable is provided comprising a dielectric layer and a plurality of sets of narrow signal conductors and wider ground conductors which are disposed in confronting relation to each other with the dielectric layer sandwiched therebetween. The signal and ground conductors are alternately arranged transversely of the conductors. The dielectric layer is preferably made of porous polytetrafluoroethylene resin. With this arrangement, crosstalk in the stripline can be greatly reduced and signals can be transmitted at higher speeds over the stripline.

6 Claims, 4 Drawing Figures

STRIP LINE CABLE

BACKGROUND OF THE INVENTION

The present invention relates to a stripline cable which generates only a small amount of crosstalk.

Transmission lines for microwaves and millimeter-wave circuits include coaxial cables and striplines as well as wave-guides. The coaxial cables and striplines comprise two conductors which are capable of direct-current transmission, and hence are widely used in transmission circuits. Particularly, the striplines have received a great deal of attention for use in information processing equipment such as computers because they can be used as a multiple-connection cables to construct relatively compact transmission lines. However, no stripline has heretofore been known which undergoes a small amount of crosstalk and is also suitable for use in transmitting high-speed pulses.

The present inventor has made studies and, as a result, found that crosstalk between signal conductors can greatly be reduced in an arrangement in which a plurality of sets of narrow signal conductors and wider ground conductors with a dielectric layer sandwiched therebetween are alternately disposed transversely of the conductors. It has also been found that signals can be transmitted at higher speeds where the dielectric layer is made of a dielectric material of a low dielectric constant such as, for example, porous polytetrafluoroethylene (PTFE) resin.

SUMMARY OF THE INVENTION

It is an object of the present invention to reduce crosstalk in a stripline.

Another object of the present invention is to achieve high speed transmission of signals over a stripline.

According to the present invention, there is provided a stripline comprising a dielectric layer and a plurality of sets of narrow signal conductors and wider ground conductors between which the dielectric layer is sandwiched, the signal and ground conductors being alternately arranged transversely of the conductors. With this arrangement, crosstalk in the stripline can be greatly reduced, and be still more greatly reduced by having the ground conductors thicker than the signal conductors.

The dielectric layer is preferably made of porous PTFE resin to provide a physically and chemically stable dielectric material having a low dielectric constant.

The above and other objects, features and advantages of the present invention will become apparent from the following description when taken in conjunction with the accompanying drawings in which certain preferred embodiments are shown by way of illustrative example.

DESCRIPTION OF THE PREFERRED EMBODIMENTS

Figure 1:
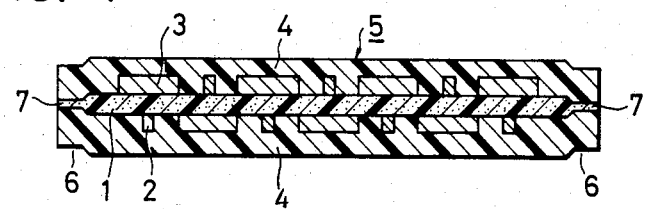
FIG. 1 is a transverse cross-sectional view of a stripline according to an embodiment of the present invention.

As shown in FIG. 1, a stripline comprises a dielectric layer 1 made of porous PTFE resin and a plurality of sets of narrow signal conductors 2 and wider ground conductors 3 disposed in confronting relation with the dielectric layer 1 being sandwiched therebetween. The signal and ground conductors 2, 3 are alternately arranged transversely of the conductors across the cable. The signal and ground conductors 2, 3 and the dielectric layer 1 are encased in a cover layer 4 made of a solid resin, preferably PTFE. For assembly, the above components are arranged as shown in FIG. 1, and pressed with heat by opposite heated rolls (not shown). The dielectric layer 1 and the cover layer 4 are caused to be thermally fused, retaining the sets of signal and ground conductors 2, 3 stably within the fused mass. Thus, the stripline 5 as completed is rendered highly stable in dimension and shape. The heated rolls has flanges to compress lateral edges 6 of the stripline 5 so that the dielectric layer 1 will have its lateral edges pressed into thinner, compressed portions 7. The compressed portions 7 of the dielectric layer 1 lose porosity and hence have a larger dielectric constant than that of the remainder of the porous dielectric layer 1. This arrangement effectively reduces crosstalk between the lateral edges of the stripline 5 and other available transmission lines.

Figure 2:
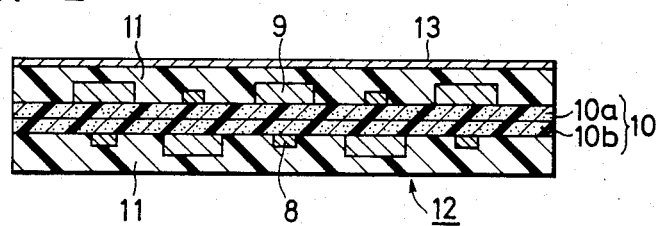
FIG. 2 is a transverse cross-sectional view of a stripline according to another embodiment.

According to another embodiment as shown in FIG. 2, a dielectric layer 10 is composed of a pair of joined first and second layers 10a, 10b made of porous PTFE resin and is sandwiched between a plurality of sets of narrow signal conductors 8 and wider ground conductors 9 alternately arranged transversely of the conductors. The signal and ground conductors 8, 9 and the dielectric layer 10 are encased in a cover 11, preferably of solid PTFE resin, thus forming a stripline 12. The stripline 12 is shown having on one surface a shield layer 13 extending the full width thereof.

Where the layer members 10a, 10b are made of porous PTFE resin they can be thermally fused to provide a required degree of bonding strength. The layer members 10a, 10b are separable from each other when they are subjected to a certain of stress or higher. Thus, the conductors 8, 9 can easily be processed for terminal splicing or connection. Since the cover 11 and the first layer 10a or the second layer 10b are bonded together with a sufficient strength, there is no danger of the conductors 8, 9 releasing from the cover 11. With the shield layer 13 disposed on one side of the stripline 12, no crosstalk will be created between a stack of such striplines 12.

Figure 3:
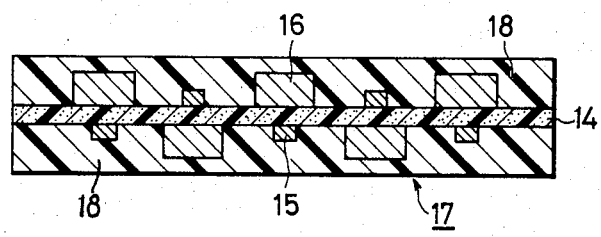
FIG. 3 is a transverse cross-sectional view of a stipline according to still another embodiment.

FIG. 3 illustrates a stripline 17 according to still another embodiment of the present invention. The stripline 17 comprises a dielectric layer 14, and a plurality of alternately arranged sets of narrow signal conductors 15 and wider ground conductors 16. The ground conductors 16 are much thicker than the signal conductors 15. The dielectric layer 14 and the signal and ground conductors 15, 16 are encased in a cover 18. With the ground conductors 16 thicker than the signal conductors 15, the signal conductors 15 are shielded more by the cover layer 18 than the ground conductors 16, rendering the stripline 17 freer from crosstalk.

Figure 4:
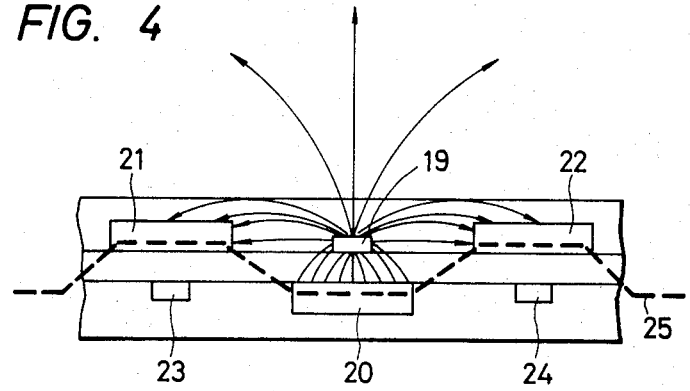
FIG. 4 is a fragmentary schematic view explanatory of the manner in which a stripline of the present invention operates.

According to the present invention, the narrow signal conductors and the wider ground conductors are alternately positioned in the transverse direction thereof. As shown in FIG. 4, such a construction forms a zigzag or staggered ground line 24 as indicated by the dotted line 25. Lines of electric force extending from a signal conductor 19 reach an opposite ground conductor 20 in the same set and adjacent ground conductors 21, 22 in adjacent sets, but almost fail to reach signal conductors 23, 24 in the adjacent sets. Accordingly, substantially no crosstalk results from the stripline of the present invention.

Experiments conducted on the stripline 5 as illustrated in FIG. 1 indicated that when a pulse having a rise time of 2.5 ns was applied to 10 meters of the stripline, the rate of attenuation of forward crosstalk between adjacent conductors was 0.45%, the rate of attenuation of backward crosstalk between adjacent conductors was 0.54%, and the rate of attenuation of crosstalk between conductors in different layers was half those described above or less. The same rates of attenuation resulted from experimentation with 3 meters of the stripline.

According to similar experiments with a conventional stripline, the rate of attenuation of forward crosstalk between adjacent conductors was 2.4%, and the rate of attenuation of backward crosstalk between adjacent conductors was 5.1%. Thus, the stripline according to the present invention reduced the rate of attenuation of forward crosstalk between adjacent conductors to about 1/5, and the rate of attentuation of backward crosstalk between adjacent conductors to about 1/9 that of the conventional stripline.

The stripline according to the present invention greatly reduces crosstalk, and is quite effective when used for transmitting information. The stripline of this invention allows stable reception and transmission of signals at its ends without undergoing crosstalk.

The stripline of the present invention is also advantageous in that the alternate arrangement of conductors in the transverse direction thereof results in a smaller transverse dimension than that of conventional striplines, and hence is a compact and lightweight stripline. The sets of conductors can be assembled in an increased density. With the dielectric layer made of porous PTFE resin, the stripline has a decreased transmission delay time and hence can transmit signals at higher speeds. Because the stripline does not increase the rise time of a signal pulse, the stripline can transmit signals having higher pulse repetition frequencies and is suitable for high-speed signal transmission.

The stripline with its dielectric layer and cover made of PTFE resin can continuously be used stably in a wide temperature range of ±260° C., and can suitably be used in a wide range of freuencies.

Although certain preferred embodiments have been shown and described in detail, it should be understood that various changes and modifications may be made therein without departing from the scope of the appended claims. For example, the dielectric layer and cover may be made of other dielectric materials having a low dielectric constant, other than PTFE. Furthermore, the dielectric layer may contain a filler material and a coloring material.

What is claimed is:

1. A stripline comprising:
   a porous dielectric layer; and
   a plurality of sets of narrow signal conductors and wider ground conductors which are disposed in confronting relation to each other with the porous dielectric layer sandwiched therebetween, said signal and ground conductors being alternately arranged transversely of the conductors, said sets of signal and ground conductors being covered with a layer of solid nonporous resin.

2. A stripline according to claim 1, wherein said dielectric layer is made of porous polytetrafluoroethylene, and said solid cover layer is solid, nonporous polytetrafluoroethylene.

3. A stripline according to claim 1, wherein said ground conductors are thicker than said signal conductors.

4. A stripline according to claim 1, including a shield layer disposed on at least one side of the stripline.

5. A stripline according to claim 1, wherein said porous dielectric layer comprises a pair of porous polytetrafluoroethylene layer members which are separable from each other when subjected to a certain stress or higher.

6. A stripline according to claim 5, wherein said layer members are made of porous polytetrafluoroethylene resin.

* * * * *

UNITED STATES PATENT AND TRADEMARK OFFICE
CERTIFICATE OF CORRECTION

PATENT NO. : 4,490,690

DATED : December 25, 1984

INVENTOR(S) : Hirosuke Suzuki

It is certified that error appears in the above-identified patent and that said Letters Patent is hereby corrected as shown below:

On the title page inventor should read

--(75) Inventor: Hirosuke Suzuki --.

Signed and Sealed this

Twenty-sixth Day of November 1985

[SEAL]

Attest:

DONALD J. QUIGG

Attesting Officer

Commissioner of Patents and Trademarks